United States Patent [19]
Camenzind et al.

[11] 3,798,753
[45] Mar. 26, 1974

[54] METHOD FOR MAKING BULK RESISTOR AND INTEGRATED CIRCUIT USING THE SAME

[75] Inventors: Hans R. Camenzind, Santa Clara; David F. Allison, Los Altos, both of Calif.

[73] Assignee: Signetics Corporation, Sunnyvale, Calif.

[22] Filed: Nov. 12, 1971

[21] Appl. No.: 198,160

Related U.S. Application Data

[62] Division of Ser. No. 791,660, Jan. 16, 1969.

[52] U.S. Cl. .......................... 29/580, 29/578, 29/577
[51] Int. Cl. .......................... B01j 17/00
[58] Field of Search .......................... 29/576 IW, 580, 577

[56] References Cited

UNITED STATES PATENTS

| | | | |
|---|---|---|---|
| 3,393,349 | 7/1968 | Huffman | 317/101 |
| 3,486,892 | 12/1969 | Rosvold | 317/235 AS |
| 3,460,006 | 8/1969 | Strull | 317/235 F |
| 3,387,193 | 6/1968 | Donald | 317/235 |
| 3,453,498 | 7/1969 | Hubner | 29/576 IW |

OTHER PUBLICATIONS

"Electronics" – March, 1967, pp. 93–96, IC Isolation : Options Offered.

*Primary Examiner*—W. C. Tupman
*Attorney, Agent, or Firm*—Flehr, Hohbach, Test, Albritton & Herbert

[57] ABSTRACT

Method for making a bulk resistor and integrated circuit using the same in which the bulk resistor is formed in a semiconductor body by the use of dielectric isolation which forms an isolated island and in which contact elements are provided at two spaced points to provide a predetermined resistance. The bulk resistor is of a type which can be readily incorporated into an integrated circuit.

2 Claims, 12 Drawing Figures

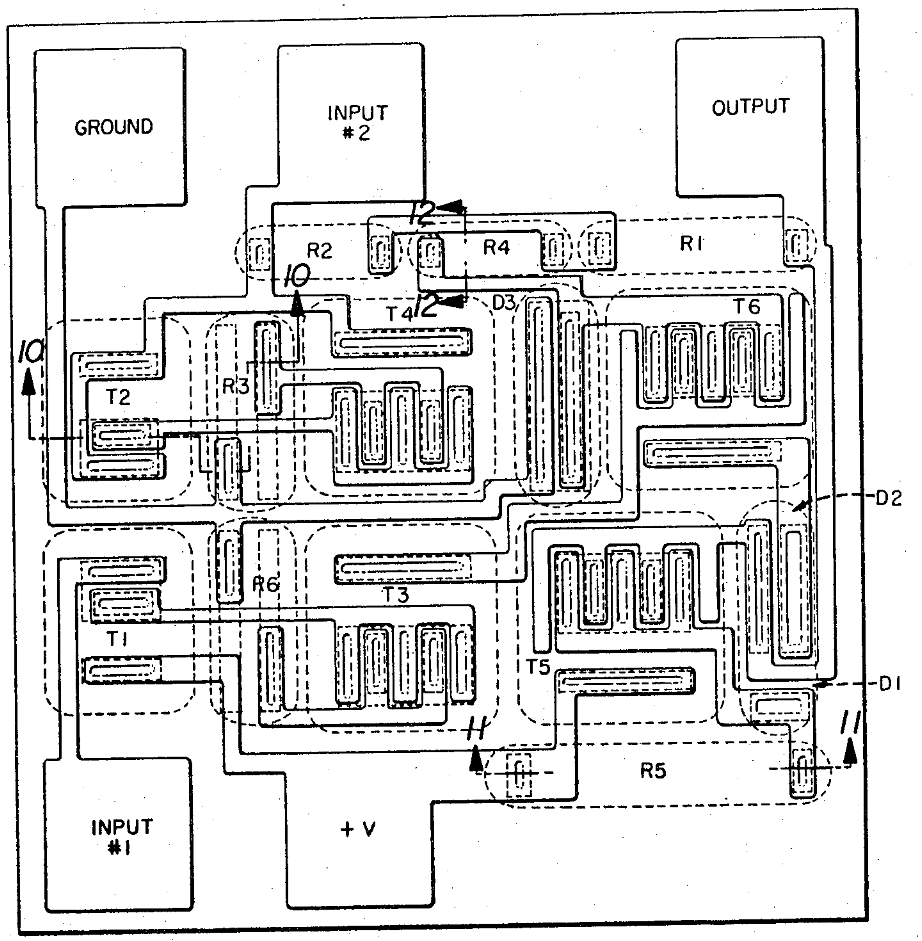
Fig. 9
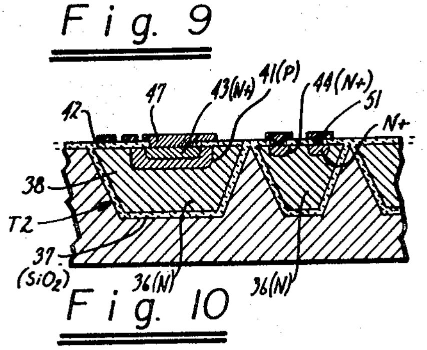
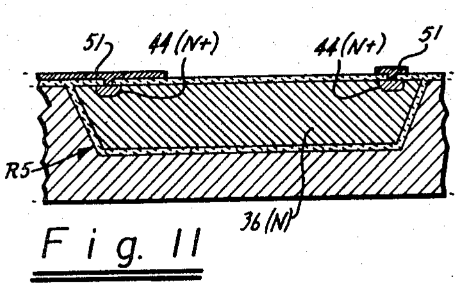
Fig. 10 Fig. 11
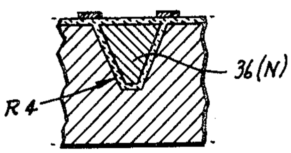
Fig. 12

METHOD FOR MAKING BULK RESISTOR AND INTEGRATED CIRCUIT USING THE SAME

CROSS REFERENCE TO RELATED APPLICATION

This application is a division of Ser. No. 791,660, filed Jan. 16, 1969.

BACKGROUND OF THE INVENTION

In the production of integrated circuits, there is a requirement for resistances having different values of resistance and particularly high values of resistance. In the past, diffused resistors have been utilized in integrated circuits but it has been very difficult, if not impossible, to obtain high values of resistance with such resistors. In addition, they have been relatively susceptible to radiation. It has been found that transient radiation bursts give rise to leakages in back biased PN junctions due to the creation of electron hole pairs. During radiation bursts, these leakages can be of such magnitude as to cause temporary circuit failure. Diffused resistors are particularly susceptible because of their relatively larger areas. There is, therefore, a need for a new and improved bulk resistor and in particular a bulk resistor which can be utilized in an integrated circuit.

SUMMARY OF THE INVENTION AND OBJECTS

The bulk resistor consists of a support structure with a semiconductor body carried by the support structure. A layer of insulating material forms at least one isolated region in the semiconductor body. The contact elements engage the island at two spaced points to provide a predetermined resistance. The construction is such that it can readily be incorporated into dielectrically isolated integrated circuits. Relatively high values and low values of resistance can be obtained merely by changing the geometry of the bulk resistance.

In general, it is an object of the present invention to provide a bulk resistor and integrated circuit using the same in which relatively high and low values of resistance can be readily obtained.

Another object of the invention is to provide a resistor and integrated circuit of the above character in which the bulk resistor can be constructed at the same time that the remainder of the integrated circuit is being formed.

Another object of the invention is to provide a resistor and integrated circuit of the above character in which the processing steps for making the same are no more complicated than for making a conventional integrated circuit.

Another object of the invention is to provide a resistor and integrated circuit of the above character which is less susceptible to radiation.

Another object of the invention is to provide a resistor and integrated circuit of the above character in which the ratios between bulk resistors in the same integrated circuit are relatively precise.

Another object of the invention is to provide a resistor and integrated circuit of the above character in which the ratios of the resistors are relatively accurate at any temperature.

Additional objects and features of the invention will appear from the following description in which the preferred embodiment is set forth in detail in conjunction with the accompanying drawing.

BRIEF DESCRIPTION OF THE DRAWING

FIG. 9 is a plan view of an integrated circuit with bulk resistors incorporating the present invention.

FIG. 10 is a cross-sectional view taken along the line 10—10 of FIG. 9.

FIG. 11 is a cross-sectional view taken along the line 11—11 of FIG. 9.

FIG. 12 is a cross-sectional view taken along the line 12—12 of FIG. 9.

DESCRIPTION OF THE PREFERRED EMBODIMENTS

The bulk resistor incorporating the present invention is made in accordance with the steps shown in FIGS. 1 through 8. The fabrication is commenced by taking a slice or body 11 of single crystal silicon of the desired resistance value. The resistance value depends upon the circuit in which the body is to be used. If it is to be utilized in a high voltage integrated circuit, 10 to 15 ohm cm. should be selected. For low voltage integrated circuits, 1 or 2 ohm cm. or even 3 ohm cm. material can be utilized.

Figure 1:
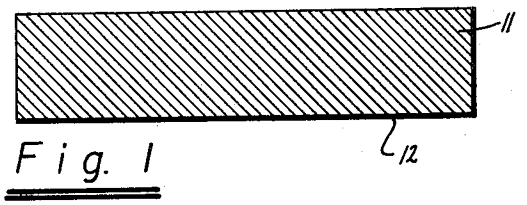
FIGS. 1 through 8 are cross-sectional views showing the processing steps utilized in forming a bulk resistor in accordance with the present invention.
Figure 2:
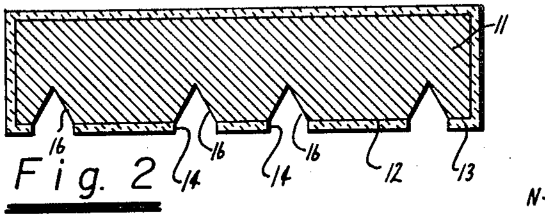

The body or slice 11 is provided with a planar surface 12. This planar surface 12 is covered with a silicon dioxide layer 13 in a conventional manner. Windows 14 are formed in the silicon dioxide layer as shown in FIG. 2 to expose portions of the surface 12 by conventional photolithographic techniques. Thereafter, grooves or recesses 16 are formed in the semiconductor body 11 by utilization of a suitable etch. Although it is not absolutely necessary, to obtain more precise bulk resistors made in accordance with the present invention, an anisotropic etch may be used. As is well known to those skilled in the art, such an etch maintains a 35.3° angle with the vertical. This is because the anisotropic etch attacks the <100> plane much faster than the <111> plane. In fact, the etching rate is 30 times faster in the <100> direction than in the <111> direction. For this reason, there is little undercutting and close spacing may be maintained. In addition, because of the precise angle of etch, the depth to which etching will occur within the semiconductor body 11 can be readily controlled by controlling the surface area of the surface 12 which can be attached by the etch. Etching will cease when the side walls which form the recess terminate in the "V" as shown in FIG. 2. It is for this reason that in cross-section the recesses or grooves 16 are substantially V-shaped.

Figure 3:
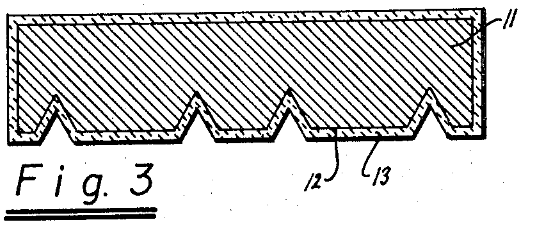
Figure 4:
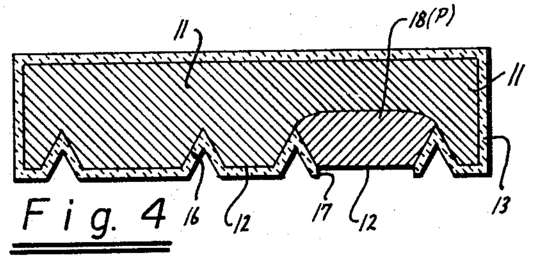
Figure 5:
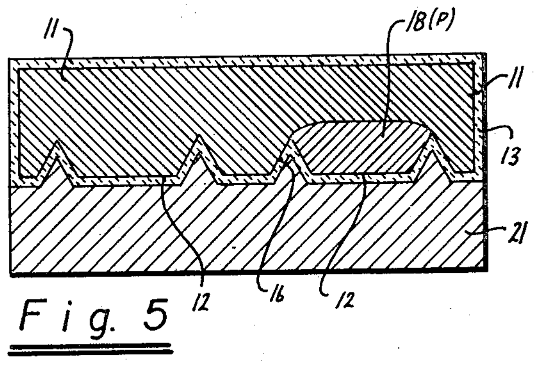

After the anisotropic etching step in FIG. 2 has been completed, the semiconductor body is re-oxidized so that silicon oxide will also form within the recesses 16 as shown in FIG. 3.

In the event that a low value of resistance is desired within the same integrated circuit, a window 17 is formed in the oxide layer 13 to expose another area of the surface 12. If it is assumed that the semiconductor body 11 is formed of an N type material, then a suitable P type dopant, such as boron, is deeply diffused through the window 17 to provide a P type region 18 which extends into the body 11 a distance which is substantially greater than the distance through which the V-shaped recesses 16 have penetrated into the body.

After the deep P type diffusion has been carried out, the silicon dioxide layer 13 is regrown so that the layer 13 extends over the P type region 18 and closes the window 17. After this has been completed, a support layer 21 is provided on the silicon dioxide layer 13 adjacent the surface 12 and extends into the V-shaped recesses or grooves 16. Typically, this support structure or layer 21 can be formed of a polycrystalline silicon which is deposited in an epitaxial reactor to the desired thickness.

Figure 6:
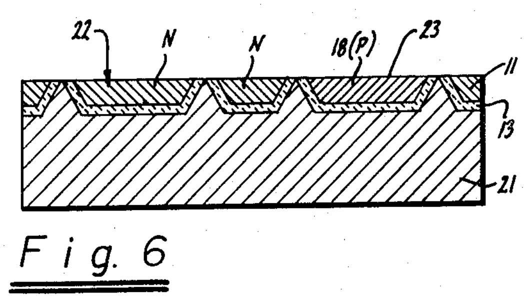

Thereafter, as shown in FIG. 6, the upper portion of the semiconductor body 11 is removed by lapping to a depth which is sufficient to expose the silicon dioxide layer which is within the grooves 16 as shown in FIG. 6 to provide a plurality of isolated islands of single crystalline semiconductor material which are isolated from each other by the dielectric layer 13 of silicon dioxide. Certain of the islands are of N type in accordance with the foregoing description. One of the islands has a P type impurity which was back diffused therein. All of the islands have planar surfaces which lie in a common plane 23 across the semiconductor body.

Figure 7:
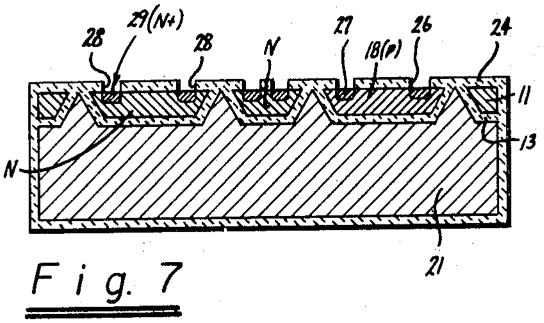
Figure 8:
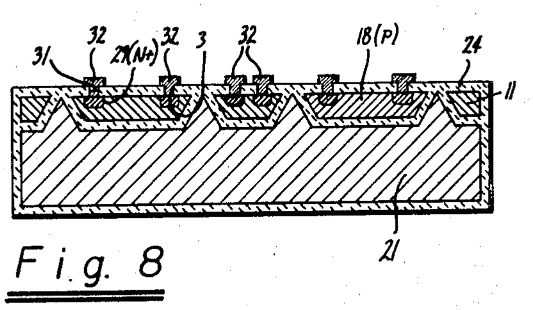

As shown in FIG. 7, a silicon dioxide layer 24 is then formed on the surface 23 and windows 26 are formed in the same overlying the P type region 18. At this time, a P type impurity would be diffused through the windows 26 to form P type contact regions 27 at opposite ends of the P type region 18 as shown in FIG. 7. Typically, this can be carried out during the base diffusion in the formation of a typical integrated circuit. Thereafter, additional windows 28 are opened over the other isolated regions 22 which would be used as bulk resistors and an N type impurity is diffused through the windows 28 to provide N+ contact regions 29. In a typical integrated circuit, these N+ contact regions 29 can be formed during the emitter diffusion.

As soon as the diffusion steps have been completed, the oxide layer 24 can be stripped and a new oxide layer grown or, alternatively, additional silicon dioxide can be grown which will close the windows 26 and 28. Thereafter, windows 31 are provided by conventional photolithographic techniques which overlie the P type regions 27 and the N+ regions 29. A metallization layer is then provided in a suitable manner such as by evaporating aluminum on the surface 24 and into the windows 31 to make contact with the P type region 27 and the N+ regions 29. Thereafter, by suitable photolithographic techniques, the undesired metallization may be removed to provide a plurality of contact elements 32 which make contact with the P type regions 27 and the N+ regions 29.

It can be seen that the foregoing steps can be carried out in conjunction with the conventional fabrication of other devices in an integrated circuit. For example, active devices such as diodes and transistors can be readily fabricated during the same processing steps which are utilized for making passive devices such as the bulk resistors.

An integrated circuit incorporating bulk resistors of the type hereinbefore described is shown in FIG. 9. The circuit shown in FIG. 9 is a video amplifier and is described in detail in copending application Ser. No. 791,661, filed Jan. 16, 1969. As can be seen from FIG. 9, this video amplifier includes a plurality of resistors, all of which are made in accordance with the present invention, i.e., they are dielectrically isolated bulk resistors.

As can be seen from the cross-sectional views shown in FIGS. 10, 11 and 12, there are provided a plurality of islands 36 formed of a single crystal silicon which are isolated from each other by a layer 37 of dielectric isolation in the form of silicon dioxide and which are supported by a support structure 38 formed of polycrystalline silicon. As can be seen, certain of isolated islands 36 are utilized for bulk resistors whereas others are used for transistors and diodes. The transistors are formed by diffusing a P type impurity into the islands to provide P-type regions 39 which are generally dish-shaped and form first PN junctions 41 which extend to the surface 42. This same diffusion would be utilized for making one region of the diodes. As explained previously, this diffusion step would also be utilized for making the P type contact elements to the back diffused bulk resistors.

An N type impurity is then diffused into the islands for forming the emitter regions 42 and to form second dish-shaped junctions 43 which are within the junctions 41 and extend to the surfaces of the islands. This same diffusion step is utilized for forming the N+ contact regions 44 for the bulk resistors.

Metallization is then provided in the manner hereinbefore described to provide a lead structure 46 which includes contact elements 47, 48 and 49 which make contact to the emitter, base and collector regions of the transistors and contact elements 51 which make contact with the N+ regions of the bulk resistors.

The cross-section shown in FIG. 10, in addition to showing the transistor T2, shows the resistor R3. The resistor R3 is what can be called a low value bulk resistor having a value of 300 ohms. As can be seen from FIG. 8, the resistor R3 is constructed in such a manner that the N+ contact areas extend longitudinally of the bulk resistor and are disposed adjacent opposite edges of the top surface of the bulk of the resistor. The contact elements 51 only engage a relatively small portion of the N+ area to make possible the cross-over from transistor T2 to transistor T4. With the construction shown for the bulk resistor R3, it can be seen that the island which forms the bulk of the resistor is a relatively narrow channel which is dielectrically isolated from the remainder of the circuit by the silicon dioxide layer 37. To obtain the low value of resistance, the contact elements 51 are disposed on opposite sides of the top part of the bulk of the resistor so that it is only necessary for the current to travel through the short dimension of the bulk of the resistor. With such an arrangement, it is readily possible to obtain value of resistance ranging from 100 ohms to 1,000 ohms.

If it is desired to obtain intermediate values of resistance, this can be obtained by extending the N+ contact portions through only a portion of the distance which represents the longest dimension of the bulk of the resistor.

The resistance R4 represents a high value bulk resistor made in accordance with the present invention and as shown in FIGS. 9 and 12. As can be seen from FIGS. 9 and 12, the bulk of the resistance is relatively long and narrow. The same is true of the resistor R5. From these cross-sections, it can be seen that the N+ regions are provided in opposite ends of the longest dimension of the bulk of the resistor and that the current travelling through the resistor must travel through the longest dimension of the resistor to thereby give higher values of resistance. With such an arrangement, it is readily possible to obtain values of resistance varying from 1,000 to 50,000 ohms, and even higher.

The advantage of utilizing the same type of resistors in an integrated circuit is that they all have the same temperature coefficient. In addition, since the resistors are made in the same way, if they err in their values, the resistors would all err in the same direction, i.e., they would all be of proportionately higher values or lower values depending on which direction the error had occurred. Such errors can be tolerated by utilizing a plurality of resistors to provide a resistance ratio which can be quite precise if the ratio is large. Thus, for example, the circuit shown in FIG. 9 has an output voltage with a ratio R5/R1 + R2. With R1 + R2 = 2R5 the output voltage is always one-half of the supply voltage. Another ratio of resistors determines the gain of the video amplifier. This is R1 + R2/R3. Input biasing is achieved by two diode-connected transistors T2 and T4 with R3 in series. The same resistor is also used in the output stage. The input stage is biased correctly when R3 and R6 are equal.

It can be seen that by using these ratios of resistors, the absolute magnitudes of the resistors used in the ratios are relatively unimportant as long as the ratios of the resistors are precise.

With the process herein described, for making dielectrically isolated bulk resistors, the surface geometries of the resistors can be accurately controlled. However, the resistivity of the material being utilized for the bulk resistors may vary slightly from slice to slice, and from one corner of one slice to the other corner of the same slice. However, since integrated circuits utilize very small portions of a slice, the resistivity variation within an integrated circuit should be very small and certainly would vary very little between two neighboring elements so they should have nearly the same resistivity. Therefore, the ratio of two resistors should be very accurate even though their absolute values might vary by 30 percent of more from the selected value.

For very low values of resistance, it is desirable to use back diffused bulk resistors of the type hereinbefore described by diffusing additional impurities into selected islands of the integrated circuit. When diffusing in from the back side, there is a diffusion gradient in which the impurities are more heavily concentrated near the surface where they enter and have a gradually lower concentration, the greater the distance from the surface through which the diffusion is made. Because of this fact, the value of the resistance is changed very little by lapping off a substantial portion of the front side of the region in which the diffusion has been carried out because the portion of the region which is lapped or removed has a very low concentration of the impurities. The portion of the region which has the greatest concentration of the impurities is not affected by the lapping operation. Thus, it is possible to fashion a very low value of resistance with a back-diffused dielectrically isolated bulk resistor. Even though the magnitude of a dielectrically isolated bulk resistor may vary substantially, the ratios of such resistors would still be relatively precise since such resistors would all be made at the same time and would err in the same direction.

It is apparent that there has been provided a new and improved dielectrically isolated bulk resistor and one which is particularly adaptable for use in integrated circuits. By utilization of an anisotropic etch, the physical configuration of the bulk resistor can be precisely controlled. All of the bulk resistors are in effect radiation hardened, that is, they are much less affected by bursts of radiation than would be a conventional diffused resistor. The dielectric isolation eliminates the need for large PN junctions which were heretofore required for diffused resistors. The bulk resistors are also very advantageous in that they can be fabricated during the same processing steps which are utilized for making transistors, diodes and other devices in conventional integrated circuits.

We claim:

1. In a method for fabricating a bulk resistor formed from a single crystal semiconductor body carrying an impurity of one conductivity type and having a surface, forming V-shaped recesses in the body extending through said surface of the body by the use of an anisotropic etch, forming a layer of insulating material on said surface and in said V-shaped recesses, diffusing an impurity of opposite conductivity type in one region of the semiconductor body extending from said surface after the use of the anisotropic etch, forming a support body on said layer of insulating material, removing a portion of the semiconductor body opposite from said surface until the layer of insulating material in the V-shaped recesses is exposed to thereby provide a plurality of isolated islands of single crystal semiconductor material having surfaces laying in a common plane and being isolated from each other and from the support body by the layer of insulating material with at least one of said islands being formed of said region having an impurity of opposite conductivity type, forming a layer of insulating material on said surfaces lying in a common plane, forming active and passive devices in said islands with one of the passive devices being a bulk resistor formed solely of the material in said one island which has an impurity of opposite conductivity type therein, said bulk resistor being the sole device in said one island, providing a lead structure on said layer of insulating material on said surfaces lying in a common plane so that the lead structure includes contact elements extending through said layer of insulating material on said surfaces lying in a common plane and engaging the active and passive devices including the bulk resistor to interconnect the same.

2. In a method for fabricating a bulk resistor formed from a single crystal semiconductor body carrying an impurity of one conductivity type and having a surface, forming V-shaped recesses in the body extending through said surface of the body by the use of an anisotropic etch, forming a layer of insulating material on said surface and in said V-shaped recesses, diffusing an impurity of opposite conductivity type in one region of the semiconductor body extending from said surface after the use of the anisotropic etch, forming a support body on said layer of insulating material, removing a portion of the semiconductor body opposite from said surface until the layer of insulating material in the V-shaped recesses is exposed to thereby provide a plurality of isolated islands of single crystal semiconductor material having surfaces lying in a common plane and being isolated from each other and from the support body by the layer of insulating material with at least one of said islands being formed of said region having an impurity of opposite conductivity type, forming a layer of insulating material on said surfaces lying in a common plane, using said one island as a bulk resistor formed solely of the material which has an impurity of opposite conductivity type therein with the bulk resistor being the sole device in said one island and providing contact elements extending through said layer of insulating material on said surface engaging said one island forming the bulk resistor at two spaced points to provide a predetermined resistance.

* * * * *